United States Patent [19]
Iino

[11] Patent Number: 5,945,731
[45] Date of Patent: Aug. 31, 1999

[54] RESIN ENCAPSULATED SEMICONDUCTOR DEVICE AND METHOD FOR MANUFACTURING THE SAME

[75] Inventor: Kazuhiro Iino, Tokyo, Japan

[73] Assignee: NEC Corporation, Japan

[21] Appl. No.: 08/730,464

[22] Filed: Oct. 11, 1996

[30] Foreign Application Priority Data

Oct. 11, 1995 [JP] Japan ..................................... 7-263097

[51] Int. Cl.$^6$ .................................................. H01L 23/495
[52] U.S. Cl. ........................... 257/672; 257/676; 257/782
[58] Field of Search ................................... 257/672, 676, 257/784, 787, 782

[56] References Cited

U.S. PATENT DOCUMENTS

| 4,289,922 | 9/1981 | Devlin ..................................... 257/670 |
| 5,185,653 | 2/1993 | Switky et al. .......................... 257/729 |

FOREIGN PATENT DOCUMENTS

| 4-146658 | 5/1992 | Japan ..................................... 257/676 |
| 4-317364 | 11/1992 | Japan ..................................... 257/676 |
| 5-326815 | 12/1993 | Japan ..................................... 257/676 |
| 6-169054 | 6/1994 | Japan ..................................... 257/676 |

*Primary Examiner*—David B. Hardy
*Attorney, Agent, or Firm*—Hayes, Soloway, Hennessey, Grossman & Hage, P.C.

[57] ABSTRACT

A resin encapsulated semiconductor device comprises a lead frame having a center portion, a plurality of inner leads extending radially outward from the center portion, a plurality of hanger leads extending radially outward from the center portion, and a plurality of outer leads each continuous to a corresponding one of the inner leads and extending radially outward from the corresponding one of the inner leads. At a position substantially corresponding to a periphery contour of a semiconductor chip when the semiconductor chip is put on the center portion of the lead frame, each of the inner leads is cut off and divided into an inner lead inside portion and an inner lead outside portion which are separated from each other. The semiconductor chip is bonded on an island formed of the center portion of the lead frame and the inner lead inside portion of each inner lead. Each inner lead outside portion is electrically connected to a corresponding external electrode of the semiconductor chip. The semiconductor chip, the island, the hanger leads and the inner lead outside portions are encapsulated with a molding resin.

7 Claims, 3 Drawing Sheets

RESIN ENCAPSULATED SEMICONDUCTOR DEVICE AND METHOD FOR MANUFACTURING THE SAME

BACKGROUND OF THE INVENTION

1. Field of the Invention

The present invention relates to a semiconductor device, and more specifically to a thinned resin encapsulated semiconductor device and a method for manufacturing the same.

2. Description of Related Art

Referring to FIG. 1, there is shown a pattern diagram of one example of a conventional lead frame for a semiconductor device. The shown lead frame is generally designated with Reference Numeral 1, and includes a rectangular island 2 to support a semiconductor chip (not shown) thereon, and a hanger lead 3 outwardly extending from each of four corners of the rectangular island 2 to an outer frame 1A of the lead frame so that the rectangular island 2 is supported by the frame of the lead frame. The lead frame 1 also includes a number of inner leads 4 extending from the outer frame 1A of the lead frame near to a periphery of the rectangular island 2. These inner leads are to be electrically connected to external electrodes formed on the semiconductor chip.

The conventional lead frame as mentioned above has been designed on the condition that the whole of a bottom surface the semiconductor chip is contacted to the island. Therefore a minimum size of the island is restricted by the size of the semiconductor chip to be put on the island. Namely, $$\text{Size of Island} > \text{Size of Semiconductor Chip} \quad (1)$$

On the other hand, a maximum size of the island is restricted from the necessity of wiring-bonding between the external electrodes of the semiconductor chip and the inner leads in order to transmit signals and electric power between the semiconductor chip and a device external to the semiconductor chip. Therefore, the following condition is required to be fulfilled:

$$\text{Size of Island} < \text{Size of Semiconductor Chip} + \text{Bonding Enable Length} \times 2 \quad (2)$$

In the prior art. in order to fulfill both the above mentioned conditions (1) and (2), even if the shape of the outer leads is the same, if the size of the semiconductor chip is different, it has been required to modify the size of the island on the basis of the size of the semiconductor chip. Therefore, in the case that semiconductor devices having the same shape of outer leads but different sizes of semiconductor chips are to be manufactured, it is necessary to prepare a plurality of different kinds of lead frames.

For example, in order to assemble the semiconductor device by using the conventional lead frame, a semiconductor chip is die-bonded on the island 2 of the lead frame 1, and a wire-bonding is carried out between the electrodes of the semiconductor chip and the inner leads 4 of the lead frame 1, and thereafter, the semiconductor chip, the island 2, the hanger leads 3 and the inner leads 4 and the bonding wires are encapsulated with a molding resin, and a lead frame portion extending outward from the encapsulating molded resin is cut out.

On the other hand, it recently becomes important to miniaturize and thin the semiconductor device in order to realize a high density packaging. For example in the case of thinning the semiconductor device, only the package (namely, encapsulating molded resin portion) is thinned without modifying the lead frame. In this case, a resin-to-metal proportion (proportion of a resin portion to a metal portion (lead frame, etc) in the package becomes small as a matter of course. As a result, when the finished semiconductor device is put under a heat cycle test, because a heat stress results from a large difference in thermal expansion coefficient between the resin and the metal, the probability of generating of package crack defect increases.

As mentioned above in order to manufacture various semiconductor devices it was necessary to prepare a plurality of different kinds of lead frames in accordance with different sizes of semiconductor chips. Nevertheless, when the chip size is suddenly changed because of change in design of the semiconductor devices, it is often difficult to immediately supply necessary lead frames fitted to the changed chip size. On the other hand, for efficient production of semiconductor devices, it is necessary to anticipate a production plan and to order the anticipated kinds of lead frames. However, this approach cannot quickly cope with an abrupt increase or decrease in demand, resulting in increased quantities of lead frames in stock.

SUMMARY OF THE INVENTION

Accordingly it is an object of the present invention to provide a semiconductor device and a method for manufacturing the same, which overcomes the above mentioned conventional defects.

Another object of the present invention is to provide a resin encapsulated semiconductor device, which can be thinned causing no package crack defects, and which can easily be used in common to different chip sizes, and a method for manufacturing the same.

The above and other objects of the present invention are achieved in accordance with the present invention by a resin encapsulated semiconductor device comprising:

an island constituted of a center portion and a plurality of inner lead inside portions extending radially outward from the center portion;

a semiconductor chip mounted on the island;

a plurality of hanger leads extending radially outward from the center portion of the island to support the island;

a plurality of inner lead outside portions each extending radially outward in an imaginary extension line of a corresponding one of the inner lead inside portions of the island but separated from an outer end of the corresponding one of the inner lead inside portions of the island, each of inner lead outside portions being electrically connected to a corresponding external electrode of the semiconductor chip;

a plurality of outer leads each continuous to a corresponding one of the inner lead outside portions and extending radially outward from the corresponding one of the inner lead outside portions; and a molded resin encapsulating the semiconductor chip, the island, the hanger leads and the inner lead outside portions.

According to another aspect of the present invention, there is provided a method for manufacturing an encapsulated semiconductor device, comprising the steps:

preparing a lead frame having a center portion, a plurality of inner leads extending radially outward from the center portion, a plurality of hanger leads extending radially outward from the center portion, and a plurality of outer leads each continuous to a corresponding one of the inner leads and extending radially outward from the corresponding one of the inner leads;

cutting off each of the inner leads at a position substantially corresponding to a periphery contour of a semiconductor chip when the semiconductor chip is put on the center portion of the lead frame, into an inner lead inside portion and an inner lead outside portion which are separated from each other, so that an island is formed of the center portion of the lead frame and the inner lead inside portion, putting and bonding the semiconductor chip on the island, electrically connecting the each inner lead outside portion to a corresponding external electrode of the semiconductor chip, and resin-encapsulating the semiconductor chips the island, the hanger leads and the inner lead inside portions.

The above and other objects, features and advantages of the present invention will be apparent from the following description of preferred embodiments of the invention with reference to the accompanying drawings.

BRIEF DESCRIPTION OF THE INVENTION

DESCRIPTION OF THE PREFERRED EMBODIMENTS

Figure 2:
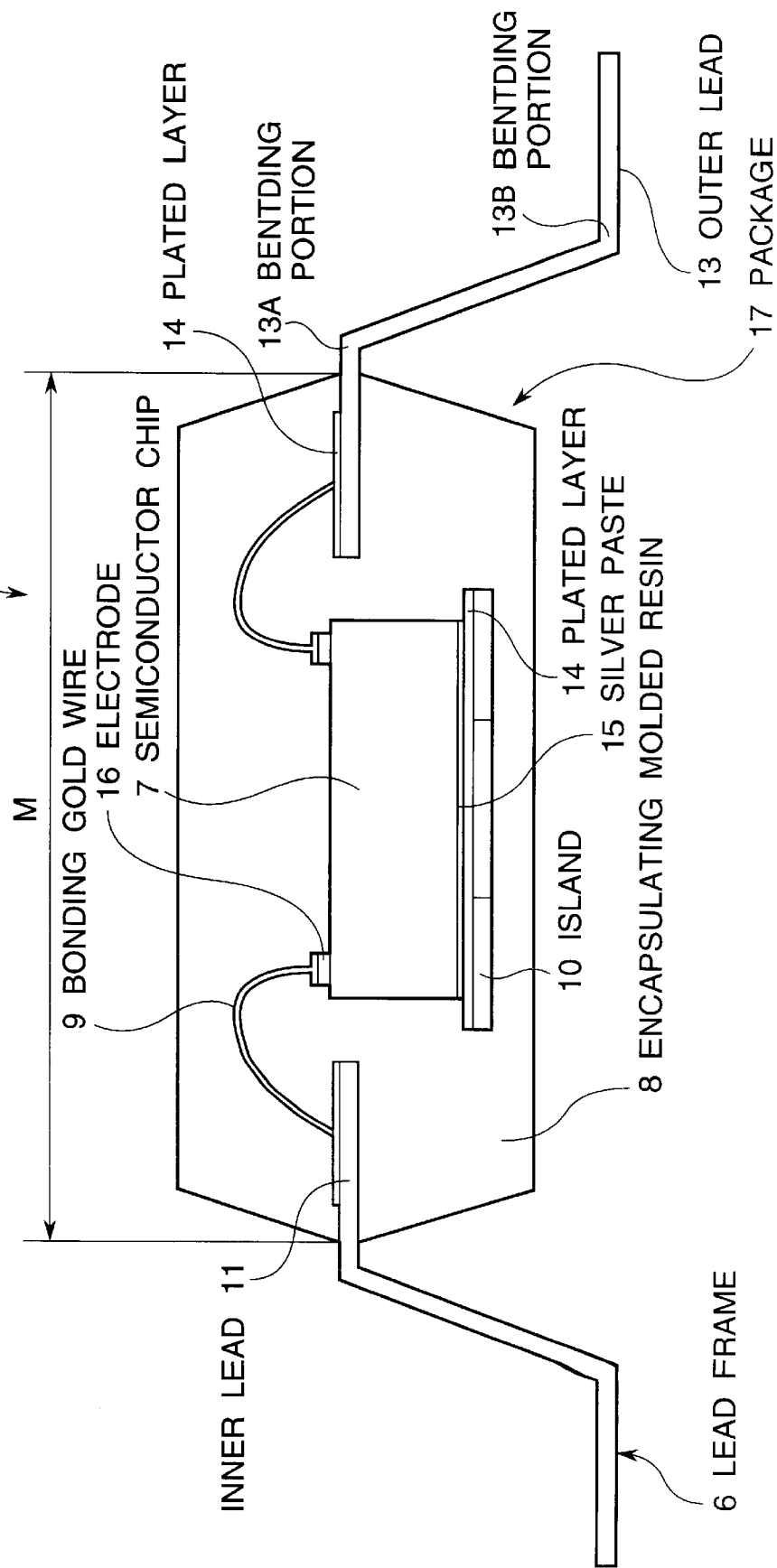
FIG. 2 is a diagrammatic vertical sectional view of all embodiment of the resin encapsulated semiconductor device in accordance with the present invention.

Referring to FIG. 2 there is shown a diagrammatic vertical sectional view of an embodiment of the resin encapsulated semiconductor device in accordance with the present invention. A diagrammatic horizontal sectional view of the shown resin encapsulated semiconductor device is shown ill FIG. 3.

Figure 3:
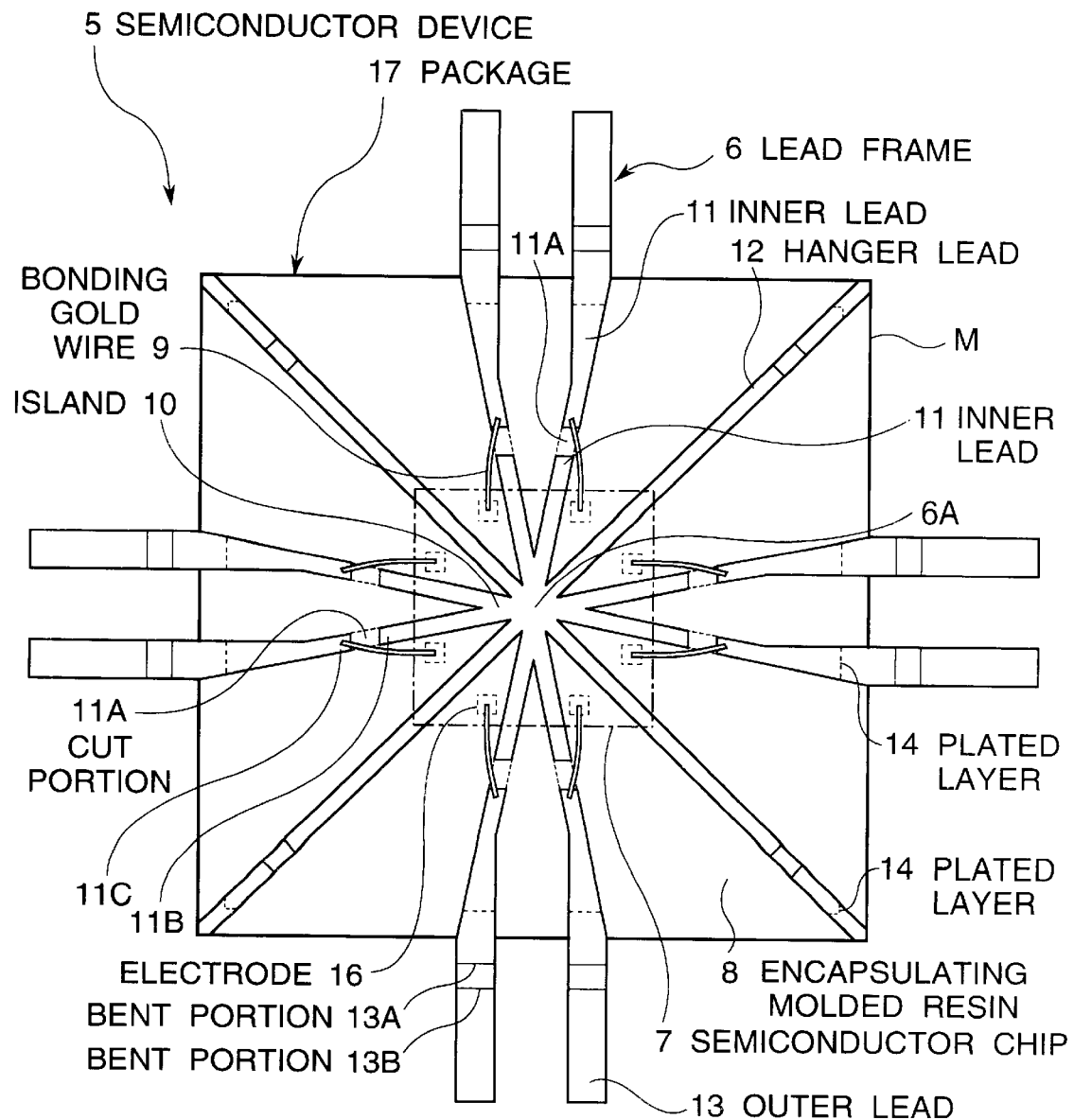
FIG. 3 is a diagrammatic horizontal sectional view of the resin encapsulated semiconductor device shown in FIG. 2.

In FIGS. 2 and 3, the semiconductor device is generally designated with Reference Numeral 5, and comprises a semiconductor chip 7 bonded on an island 10 of a semiconductor device lead frame 6, and encapsulated with a resin mode 8. The semiconductor device lead frame 6 includes, in addition to the island 10, a plurality of inner leads 11, a plurality of hanger leads 12, and a plurality of outer leads 13 each continuous to and extending outward from a corresponding one of the inner leads 11. In the following, the semiconductor device lead frame will be callers simply a "lead frame".

As shown in FIG. 2 an upper surface of the lead frame 6 has a plated layer 14 having a thickness of 5 $\mu$m over a zone which is inner to a contour of a resin encapsulating zone "M" by 0.2 mm. The semiconductor chip 7 is fixedly bonded on the island 10 by a silver paste 15.

Each of external electrodes formed at a peripheral portion of an upper surface of the semiconductor chip 7 is electrically connected through a gold wire 9 having a diameter of 30 $\mu$m to a corresponding one of the inner leads 11 of the lead frame 6. The inner leads 11, the gold wires 9, the semiconductor chip 7 bonded to the island 10, the hanger leads 12 are encapsulated with a molded resin 8, so as to constitute the packaged semiconductor device 5. Each of the outer leads 13 extending outward from the encapsulating resin mold 8 is bent at two bending portions 13A and 13B, as shown in FIG. 2.

As shown in FIG. 3, the encapsulating resin mold 8 is square in a plan view, and the semiconductor chip 7 is also square in a elan view. The finished package 17 is square.

In the shown embodiment, the lead frame 6 having eight inner leads 11, each two inner leads extending radially outward from a center portion 6A of the lead frame with a constant width, to cross a middle portion of a corresponding side of four sides of the square package 17, perpendicularly to the corresponding side of the square package 17, but having a cut-out portion 11A in the way, as shown by an imaginary line in FIG. 3. The center portion 6A and an inner lead inside portion 11B of each of the eight inner lead 11, at the inside of the cut-out portion 11A, constitutes the island 10. Furthermore, four hanger leads 12 extend outward from the center portion 6A of the lead frame in four diagonal directions of the square package 17.

Inner lead outside portions 11C of the inner leads 11, at the outside of the cut-out portion 11A, are provided to be electrically connected to the external electrodes 16 provided at the peripheral portion of the semiconductor chip 9, for signal and electric power transmission between the semiconductor chip and an external device. A portion of each inner lead at the outside of the contour line of the resin encapsulating zone "M" constitutes the outer lead 13.

Figure 1:
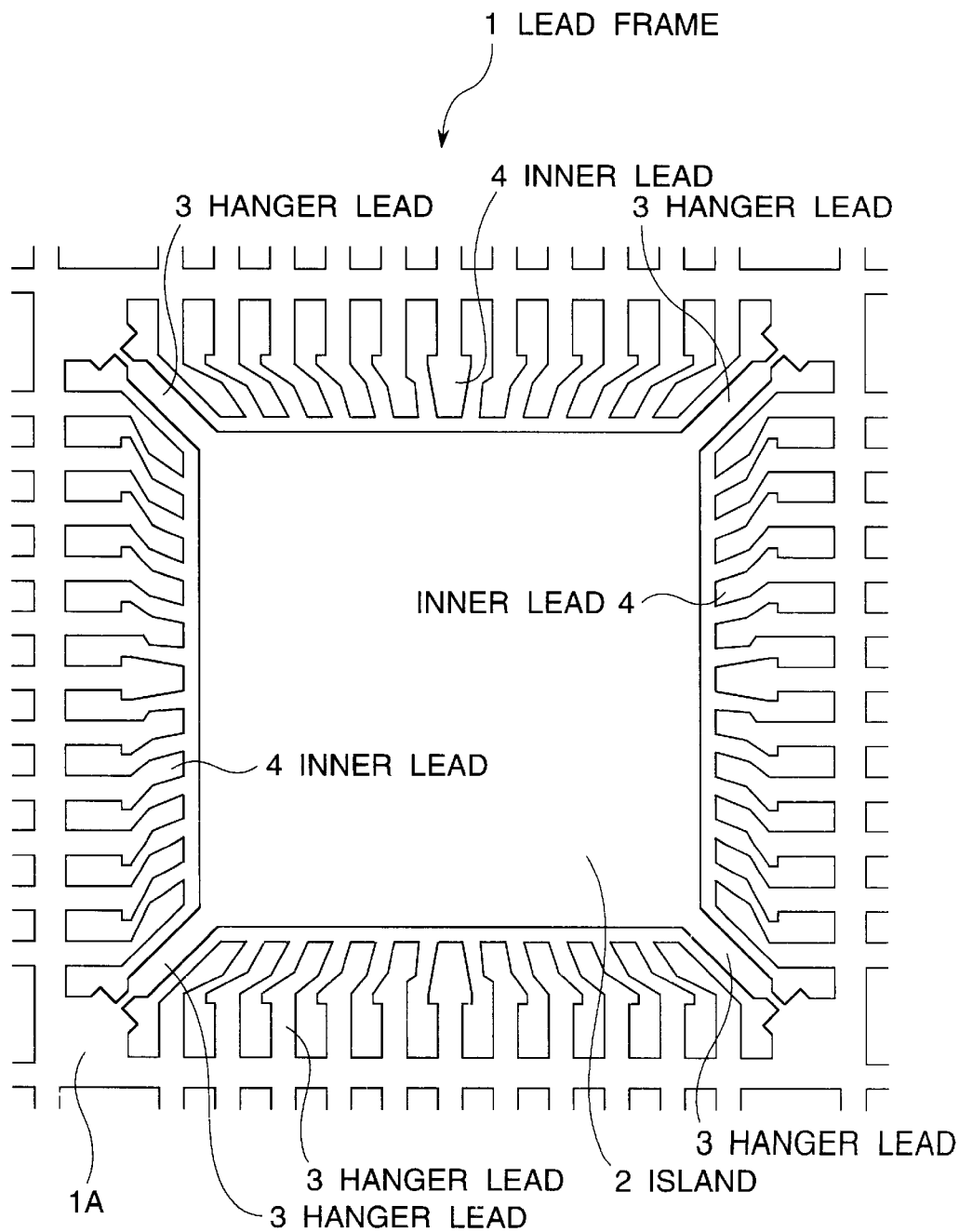
FIG. 1 is a pattern diagram of one example of a conventional lead frame for a semiconductor device.

In the lead frame before the semiconductor device has been packaged, the hanger leads 12 extend to an outer frame (not shown) similar to the outer frame 1A of the lead frame 1 shown in FIG. 1, so as to support the island to the outer frame of the lead frame.

As mentioned above, the semiconductor chip 7 is put on and supported by the island 10 of the lead frame 6, and the cut-out portion 11A of the inner lead 11 is positioned at a location outward remote from a contour line of the semiconductor chip 7 by 2mm. The gold wire 9 is bonded to interconnect between each one external electrode 16 of the semiconductor chip 7 and the inner lead outside portion 11C of a corresponding inner lead 11 which is at the outside of the cut-out portion 11A.

Now, a process for manufacturing the above mentioned semiconductor device 5 will be described.

First the lead frame 6 having the plated layer 14 is beforehand prepared. At this time, the outer leads 13 of the lead frame 6 have not yet been bent at the bending positions 13A and 13B, and the inner leads 11 have not yet cut off at the cut-out portion 11 A so that the island 10, the inner leads 11 and the outer leads 13 are continuous to and integral with one another. On the other hand, the semiconductor chip 7 is cut out from a wafer into a discrete chip, and a silver paste 15 is deposited on a rear surface of the semiconductor chip 7.

Thereafter, the inner leads 11 are cut off at a position which will be outwardly remote from the peripheral edge of the semiconductor chip 7 by 2 mm when the semiconductor chip 6 is bonded to the center portion 6A of the lead frame 6. At this time, however, the hanger leads 12 are not yet cut off, and preferably, only the eight inner leads 11 extending in four orthogonal directions in the shown embodiment are cut off by use of for example a cutting die (not shown). Thus, there is formed the island which is supported by the hanger leads 12 but separated from the outside portions 11C of the inner leads 11 and which is used for supporting the semiconductor chip 7. For example, the cutting die was driven by a press machine adjusted to have a pressure of 5 Kg/cm², and a time required for exchanging the cutting die was on the order of five minutes.

In addition a positioning of the cutting die in relation to the lead frame 6 can be made by utilizing sprocket holes (not shown) conventionally formed in the outer frame of the lead frame for feeding the lead frame. It was confirmed that, in this method, the cut-out portion 11A could be formed with a precision of not greater than ±0.1 mm.

Then, the semiconductor chip 7 is mounted on the island 10 and the hanger leads 12 in such a manner that the silver paste 15 deposited on the rear surface of is brought into contact with the plated layer 14 of the island 10 and the hanger leads 12. In this condition a heating treatment is conducted at a temperature of 250° C. for three hours, so that the silver paste is solidified or metallized, with the result that the semiconductor chip 7 is firmly bonded to the island 10 and the hanger leads 12.

Furthermore a wiring bonding is conducted by applying ultrasonic waves under the condition that a substrate temperature of 200° C., a load of 60 g/wire all ultrasonic wave power of 25 W/wire, and an ultrasonic wave applying time of 1.5 msce/wire, for the purpose it bonding the gold wire 9 to the external electrodes 16 of the semiconductor chip 7 and the inner leads 11. In this connection, it was confirmed that, when the gold wire is bonding, if the load becomes not less than 500 g/wire, or if the ultrasonic wave power becomes not less than 100 W/wire, the semiconductor chip 7 is destroyed.

Then, the semiconductor chip and the lead frame thus prepared are put in a molding die (not shown), and a resin is injected into the molding die with a molding die temperature of 175° C. and an injection molding pressure of 182 Kg/cm$^2$, and thereafter, is heated at 175° C. for eight hours, so that a molded resin 8 is completely hardened. Here, it was confirmed that, when the molding resin is charged, if the molding die temperature is not greater than 150° C., or if tile injection molding pressure is not greater than 150Kg/cm$^2$, voids remain in the molded resin 8.

Finally, the outer leads 13 are plated with a solder of 70% Sn-Pb with a thickness of 5 $\mu$m to 20 $\mu$m, and then, are bent at the bending portions 13A and 13B, as shown in FIG. 2. Thus, the semiconductor device in accordance with the embodiment of the present invention is completed.

In the semiconductor device of the above mentioned embodiment the island 10 for supporting the semiconductor chip 7 is constituted of the eight inner leads 11 which extend radially outward. As a result, the resin 8 enters into spaces between the inner leads 11 and spaces between the inner leads 11 and the hanger leads 12 adjacent thereto. Namely, the resin 8 enters the inside of the island 10, so that an anchor effect is increased.

Comparing the package of the above mentioned embodiment with the conventional package of the same size, the semiconductor device of the above mentioned embodiment has the resin-to-metal proportion in the package 17 which is higher than that of the conventional semiconductor device which uses a square solid island. Accordingly, if a minimum amount of resin of a non-defective package (in which no package crack defect occurs) is known in the process of a package designing, the minimum amount of resin can be ensured in the semiconductor device in accordance with tie present invention even if a thickness between a rear surface of the island and a bottom surface of the package is made smaller than the conventional semiconductor device package. Therefore, the semiconductor device package in accordance with the present invention can be thinned in comparison with the conventional semiconductor device package. Alternatively, if it is known that a package crack defect occurs with a certain amount of resin the semiconductor device in accordance with the present invention can reduce the amount of metal in the lead frame with the result that the amount of resin is relatively increased and therefore the resin-to-metal proportion in the package is improved, thereby to realize a semiconductor device where it is hard to generate a package crack.

In the semiconductor device 5 of the above mentioned embodiment, a heat cycle test of −55° C. to 150° C. was conducted after the semiconductor device 5 was caused to absorb moisture. It was confirmed that the resin encapsulated package having a thickness of 1.0 mm has a strength higher than that of the conventional package of the same size.

On the other hand, in the process in accordance with the present invention for manufacturing the semiconductor device, the cut-off position of the inner leads 11 is changed in accordance with the size of the semiconductor chip 7 with the result that the size of the island 10 which matches with different sizes of the semiconductor chip 7 can be freely formed. Accordingly, different semiconductors devices which however are the same in an outer configuration (in the number of outer leads, in the shape of outer leads, in the location of outer leads, etc.), can be manufactured with only one kind of lead frame. Therefore, even if the chip size is suddenly changed because of change in design of the semiconductor devices, it is possible to easily comply with the sudden change of chip size, and therefore, it is possible to quickly cope with an abrupt increase or decrease of demand. Accordingly, the quantities of lead frames in stock can be reduced.

The invention has thus been shown and described with reference to the specific embodiments. However, it should be noted that the present invention is in no way limited to the details of the illustrated structures but changes and modifications may be made within the scope of the appended claims.

For example, the numbers, the shapes and the locations of the inner leads, the outer leads and the hanger leads can be easily modified in design in order to apply the present invention to various shapes of resin encapsulated semiconductor devices. The reference for positioning the molding die in relation to the lead frame is not limited to the sprocket holes of the lead frame, but for example, a small projection and others can be used as the reference position.

I claim:

1. A resin encapsulated semiconductor device comprising:

an island comprising a center portion and a plurality of spaced inner lead inside portions extending radially outward from said center portion and defining spaces therebetween extending in a radially outward direction;

a semiconductor chip mounted on said center portion and said inside portions of said island so that only a portion of a bonding surface of said semiconductor chip is covered by said center portion and said inner lead portions of said island;

a plurality of hanger leads extending radially outward from said center portion of said island to support said island;

a plurality of inner lead outside portions each extending radially outward in an imaginary extension line of a corresponding one of said inner lead inside portions of said island but separated from an outer end of said corresponding one of said inner lead inside portions of said island, each of said inner lead outside portions being electrically connected to a corresponding external electrode of said semiconductor chip;

a plurality of outer leads each continuous to a corresponding one of said inner lead outside portions and extending radially outward from said corresponding one of said inner lead outside portions; and a molded resin encapsulating said semiconductor chip, said island, said hanger leads and said inner lead outside portions, whereby, under said semiconductor chip, spaces between said inner lead inside portions and spaces between said inner lead inside portions and said hanger leads adjacent thereto are charged with said molded resin.

2. The semiconductor device as claimed in claim 1, wherein said semiconductor chip is bonded to said island by means of a silver paste.

3. The semiconductor device as claimed in claim 1, and comprising eight inner leads extending in four orthogonal directions.

4. A method for manufacturing an encapsulated semiconductor device, comprising the steps:

preparing a lead frame having a center portion, a plurality of spaced inner leads extending radially outward from said center portion and defining spaces therebetween extending in a radially outward direction, a plurality of hanger leads extending radially outward from said center portion, and a plurality of outer leads each continuous to a corresponding one of said inner leads and extending radially outward from said corresponding one of said inner leads;

cutting off each of said inner leads at a position substantially corresponding to a periphery contour of a semiconductor chip when said semiconductor chip is put on said center portion of said lead frame, into an inner lead inside portion and an inner lead outside portion which are separated from each other, so that an island is formed of said center portion of said lead frame and said inner lead inside portion, supported on said center portion and said inside portions of said island so that only a portion of a bonding surface of said semiconductor chip is covered by said center portion and said inner lead portions of said island;

placing and bonding said semiconductor chip on said island;

electrically connecting said each inner lead outside portion to a corresponding external electrode of said semiconductor chip, and resin-encapsulating said semiconductor chip, said island, said hanger leads and said inner lead inside portions, so as to fill spaces between said inner lead inside portions and spaces between said inner lead inside portions and said hanger leads adjacent thereto, under said semiconductor chip.

5. The method according to claim 2, wherein said semiconductor chip is bonded to said island using a silver paste.

6. The method according to claim 5, wherein said silver paste is solidified by heat treating.

7. The method according to claim 2, wherein said inner lead outside portions are connected to corresponding external electrodes of said semiconductor chips by application of ultrasonic energy.

* * * * *